United States Patent
Wang et al.

(10) Patent No.: US 10,169,506 B2
(45) Date of Patent: Jan. 1, 2019

(54) CIRCUIT DESIGN METHOD AND SYSTEM

(71) Applicant: TAIWAN SEMICONDUCTOR MANUFACTURING COMPANY, LTD., Hsinchu (TW)

(72) Inventors: Chung-Hsing Wang, Baoshan Township (TW); King-Ho Tam, Zhudong Township (TW); Yen-Pin Chen, Taipei (TW); Wen-Hao Chen, Hsinchu (TW); Chung-Kai Lin, Taipei (TW); Chih-Hsiang Yao, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/299,711

(22) Filed: Oct. 21, 2016

(65) Prior Publication Data

US 2017/0039310 A1    Feb. 9, 2017

Related U.S. Application Data

(62) Division of application No. 14/446,752, filed on Jul. 30, 2014, now Pat. No. 9,477,803.

(51) Int. Cl.
*G06F 17/50* (2006.01)

(52) U.S. Cl.
CPC ...... *G06F 17/5036* (2013.01); *G06F 17/5009* (2013.01); *G06F 17/5081* (2013.01)

(58) Field of Classification Search
CPC .......... G06F 17/5031; G06F 17/5036; G06F 17/5045; G06F 17/5081; G06F 2217/63; G06F 2217/84

USPC ................................. 716/108, 113
See application file for complete search history.

(56) References Cited

U.S. PATENT DOCUMENTS

| | | | |
|---|---|---|---|
| 8,024,675 B1 | 9/2011 | Gupta | |
| 2005/0149777 A1 | 7/2005 | Yuan | |
| 2009/0075178 A1 | 3/2009 | Jahnke | |
| 2009/0307645 A1* | 12/2009 | Buck | G06F 17/5036 716/115 |
| 2009/0327983 A1 | 12/2009 | Li | |
| 2010/0057411 A1 | 3/2010 | Li | |
| 2010/0117080 A1 | 5/2010 | Chen | |
| 2014/0351779 A1 | 11/2014 | Ren | |

* cited by examiner

*Primary Examiner* — Paul Dinh
(74) *Attorney, Agent, or Firm* — Hauptman Ham, LLP

(57) ABSTRACT

A method of designing a circuit includes designing a first layout of the circuit based on a first plurality of corner variation values for an electrical characteristic of a corresponding plurality of back end of line (BEOL) features of the circuit. Based on the layout, a processor calculates a first delay attributable to the plurality of BEOL features and a second delay attributable to a plurality of front end of line (FEOL) devices of the circuit. If the first delay is greater than the second delay, a second layout of the circuit is designed based on a second plurality of corner variation values for the electrical characteristic of the corresponding plurality of BEOL features. Each corner variation value of the first plurality of corner variation values is obtained by multiplying a corresponding corner variation value of the second plurality of corner variation values by a corresponding scaling factor.

20 Claims, 4 Drawing Sheets

CIRCUIT DESIGN METHOD AND SYSTEM

PRIORITY CLAIM

The present application is a divisional of U.S. application Ser. No. 14/446,752 (now U.S. Pat. No. 9,477,803), filed Jul. 30, 2014, which is incorporated herein by reference in its entirety.

BACKGROUND

During manufacturing of integrated circuits, process variations result in formation of actual devices and features which have some differences from designed devices and features. Circuit designers will verify a circuit design in order to account for these differences between designed devices and features and the actual devices and features.

In some approaches, circuit designers design each device and feature to account for a worst case process corner. A process corner is a characterization of performance of an actual device or feature relative to other devices or features. In some instances, the worst case process corner is the slow process corner where a produced device operates slower than the designed device or the produced feature transfers a signal slower than the designed feature.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
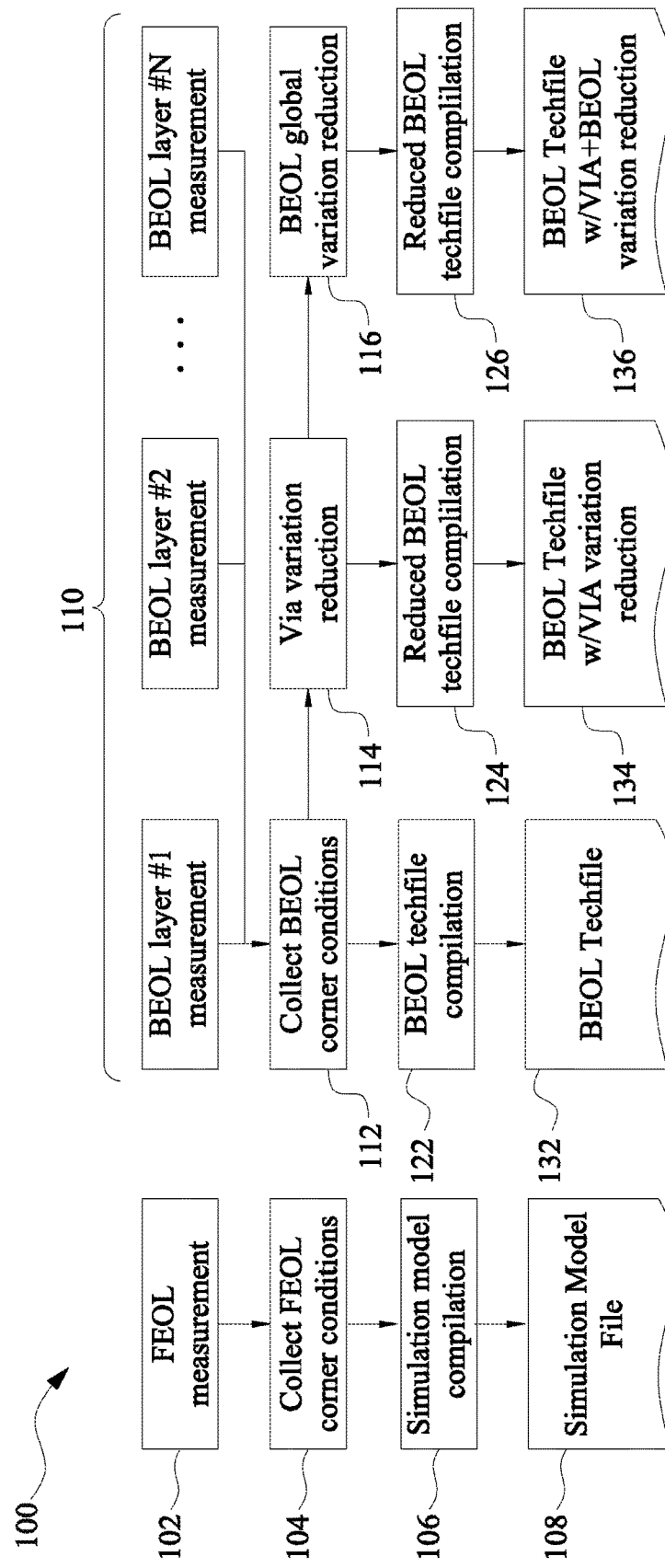
FIG. 1 is a flowchart of a method of generating one or more techfiles and/or simulation model files usable in a subsequent resistance-capacitance extraction process in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of a method 100 of generating one or more techfiles and/or simulation model files usable in a subsequent resistance-capacitance extraction process in accordance with some embodiments. It is understood that additional operations may be performed before, during, and/or after the method 100 depicted in FIG. 1, and that some other processes may only be briefly described herein.

A circuit includes front end of line (FEOL) devices as well as back end of line (BEOL) features configured to be electrically connected separate FEOL devices together. In some embodiments, FEOL devices include transistors, resistors, switching devices or other suitable devices. In some embodiments, BEOL features include conductive lines, conductive vias, capacitors, fuses, or other suitable devices.

Method 100 begins with operation 102 in which FEOL measurements of one or more electrical characteristics of FEOL devices corresponding to a predetermined fabrication process are performed. In some embodiments, operation 102 is performed based on one or more sample integrated circuit chips fabricated by the predetermined fabrication process. In some embodiments, the one or more sample integrated circuit chips are test-key chips. In some embodiments, the one or more sample integrated circuit chips are sampled commercial products. In some embodiments, the one or more electrical characteristics include switching speed, signal delay, resistance, capacitance, or other suitable information. In some embodiments, the one or more electrical characteristics include ranges for switching speed, signal delay, resistance, capacitance, or the other suitable information. In some embodiments, the one or more electrical characteristics are obtained using a simulation program executed by a processor. In some embodiments, the one or more electrical characteristics are obtained based on empirical results from prior manufacturing results.

Method 100 continues with operation 104 in which FEOL corner conditions are collected. The FEOL corner conditions include the one or more electrical characteristics for FEOL devices in the fast process corner, the typical condition, as well as in the slow process corner. The typical condition refers to an ideal condition without any process variations. In some embodiments, the typical condition includes a typical value of a unit resistance value. In some embodiments, the typical condition includes a typical value of a unit capacitance value. The fast process corner describes produced FEOL devices which operate at a faster speed than the typical condition. The slow process corner describes produced FEOL devices which operate at a slower speed than the typical condition.

Method 100 continues with operation 106 in which a simulation model compilation is performed. As a result, a simulation model file 108 usable in a subsequent resistance-capacitance extraction or timing analysis is generated. In some embodiments, the simulation model includes a simulation program with integrated circuit emphasis (SPICE) model.

In operation 110, BEOL measurements are performed for each layer of interconnect structures, such as via plugs and conductive lines. In some embodiments, operation 110 is performed based on one or more sample integrated circuit chips fabricated by the predetermined fabrication process. In some embodiments, the one or more sample integrated circuit chips are test-key chips. In some embodiments, the one or more sample integrated circuit chips are sampled commercial products. In some embodiments, the BEOL measurements are performed sequentially for each layer of the interconnect structures. In some embodiments, the BEOL measurements are performed simultaneously for at least two layers of the interconnect structure. In some embodiments, the electrical characteristics to be determined during operation 110 include resistance, capacitance, signal delay, or other suitable information. In some embodiments, the electrical characteristics include ranges for resistance, signal delay or other suitable information. In some embodiments, the electrical characteristics are obtained using a simulation program executed by a processor. In some embodiments, the performance data is obtained based on empirical results from prior manufacturing results. In some embodiments, the BEOL measurements are obtained sequentially with the FEOL measurements. In some embodiments, the BEOL measurements are obtained simultaneously with the FEOL measurements.

Method 100 continues with operation 112 in which BEOL corner conditions are collected. The BEOL corner conditions include electrical characteristics for BEOL devices in the fast process corner, the typical condition, as well as in the slow process corner. In some embodiments, the BEOL corner conditions are recorded in a form of values of various technology parameters. In some embodiments, the technology parameters include dielectric permittivity, resistance, capacitance, and other suitable technology parameters. In some embodiments, the typical condition includes a typical value of a unit resistance value. In some embodiments, the typical condition includes a typical value of a unit capacitance value. In order to more accurately determine an electrical characteristic of BEOL features while still accounting for production variations, method 100 includes operation 114 and operation 116 which help to reduce pessimism in the variation values of the technology parameters usable in the subsequent resistance-capacitance extraction and/or timing analysis of a circuit design while the circuit still satisfies the desired performance characteristics.

Method 100 continues with operation 122, where a techfile 132 is generated based on typical values and corner variation values from operation 112.

In operation 114, a via variation reduction process is performed based on the measurement from operations 110 and 112. The via variation reduction process utilizes an assumption that variations among different via plugs within an interconnect structure will be independent variables and have a Gaussian distribution, and thus effectively act to cancel each other. In other words, it is highly unlikely to have all via plugs manufactured by the predetermined fabrication process to be all at the slowest corner condition or all at the fastest corner condition. The via variation reduction process is applicable to all circuit designs which include an interconnect structure between separate FEOL devices.

In some embodiments, the via variation reduction process takes into account the relative size of via plugs in different levels of the interconnect structure. In some instances, via plugs located farther from a substrate have larger dimensions in order to effectively transfer higher currents and voltages. The larger dimensions result in a lower variation of the via plugs in levels of the interconnect structure remote from the substrate. The lower amount of variation in the larger via plugs results in the lower level via plugs dominating delay variation introduced by the BEOL features. For example, if a lower via plug contributes 100 picoseconds (ps) to the delay variation while an upper via plug contributes 1 ps, the resulting overall delay variation would become $\sqrt{100^2+1^2} \approx 100$. The larger dimensions of the upper vias also cause a lower average resistance in comparison with vias located closer to the substrate.

In some embodiments, the via variation reduction process takes into account the relative position of via plugs. In some embodiments, a signal path is defined as traversing from a driving electrical component through various via plugs and conductive lines and then reaching a receiving electrical component. In some embodiments, an up-stream via plug along the signal path dominates the overall delay variation of the signal path than a down-stream via plug. However, at the stage of preparing techfiles, it is unknown how a circuit designer will place various via plugs. Nevertheless, it is reasonable to assume that a lower level via plug has a 50-50 chance to be either the most variation-dominant via plug or the least variation-dominant via plug of a signal path, while a higher level via plug tends to be in the middle of affecting the overall delay variation of the signal path. As a result, lower level via plugs tends to statistically dominate the delay variation.

In some embodiments, the via variation reduction process reduces a variation value from a corresponding original corner variation value of a technology parameter of the BEOL features in interconnect levels above a threshold level. In some embodiments, the variation of the technology parameter is reduced to zero, meaning that the BEOL feature is formed as set forth in the initial design without accounting for manufacturing variation. In some embodiments, the via variation reduction process using a weighting factor to reduce an amount of variation of the technology parameters of BEOL features in interconnect levels above the threshold level. In some embodiments, the threshold level is set to a predetermined percentage of a number of interconnect levels. In some embodiments, the predetermined percentage ranges from about 33% to about 67%.

In some embodiments, the via variation reduction process takes Elmore delay into account. Elmore delay describes a propagation of a signal through a resistance-capacitance (RC) network, such as an interconnect structure. Elmore delay indicates that a delay associated with a particular element of the RC network is a summation of the RC delay of the particular element and each downstream element. As a result, a delay associated with elements closer to an output of the RC network is less than a delay associated with elements closer to an input of the RC network. In circuits where the variation of via resistance has a Gaussian distribution, a variation of Elmore delay is given by:

$$\Delta_{elmore} = \text{sqrt}(\Sigma_{i=1-N}(\delta_i * C_i)^2 + \Sigma_{i=2-N}(\delta_i * C_i)^2 + \ldots \Sigma_{i=N}(\delta_i * C_i)^2) \qquad \text{Eq. (1)}$$

where $\Delta_{elmore}$ is the variation of Elmore delay, $\delta_i$ is the variation of the via resistance of the $i^{th}$ via, and $C_i$ is the capacitance of the $i^{th}$ via.

As indicated by Equation 1, the variation in Elmore delay is impacted by elements closer to the input of the RC network. In some embodiments, the via variation reduction process reduces variation added to BEOL features beyond a threshold element in the RC network. In some embodiments, the threshold element is set to a predetermined percentage of a number of elements in the RC network. In some embodiments, the predetermined percentage ranges from about 33% to about 67%.

In some embodiments, the via variation reduction process using a scaling factor to reduce variation of technology parameters for BEOL features. In some embodiments, for an i-th layer of via plugs from a bottom of the BEOL features, an order index i being a positive integer, the scaling factor is set as $$\frac{1}{\sqrt{i}}.$$

An order of the layer of via plugs is determined according to a distance of a particular layer of features from a substrate. In some embodiments which include the scaling factor, the determined corner variation values, e.g., from operation 112, is multiplied by the scaling factor in order to scale down the variation values of the technology parameters of BEOL features. In some embodiments, the scaling factor is implemented within an automated circuit design tool. In some embodiments where the scaling factor is implemented within the automated circuit design tool, the fabrication process engineer is permitted to alter the scaling factor.

Figure 3:
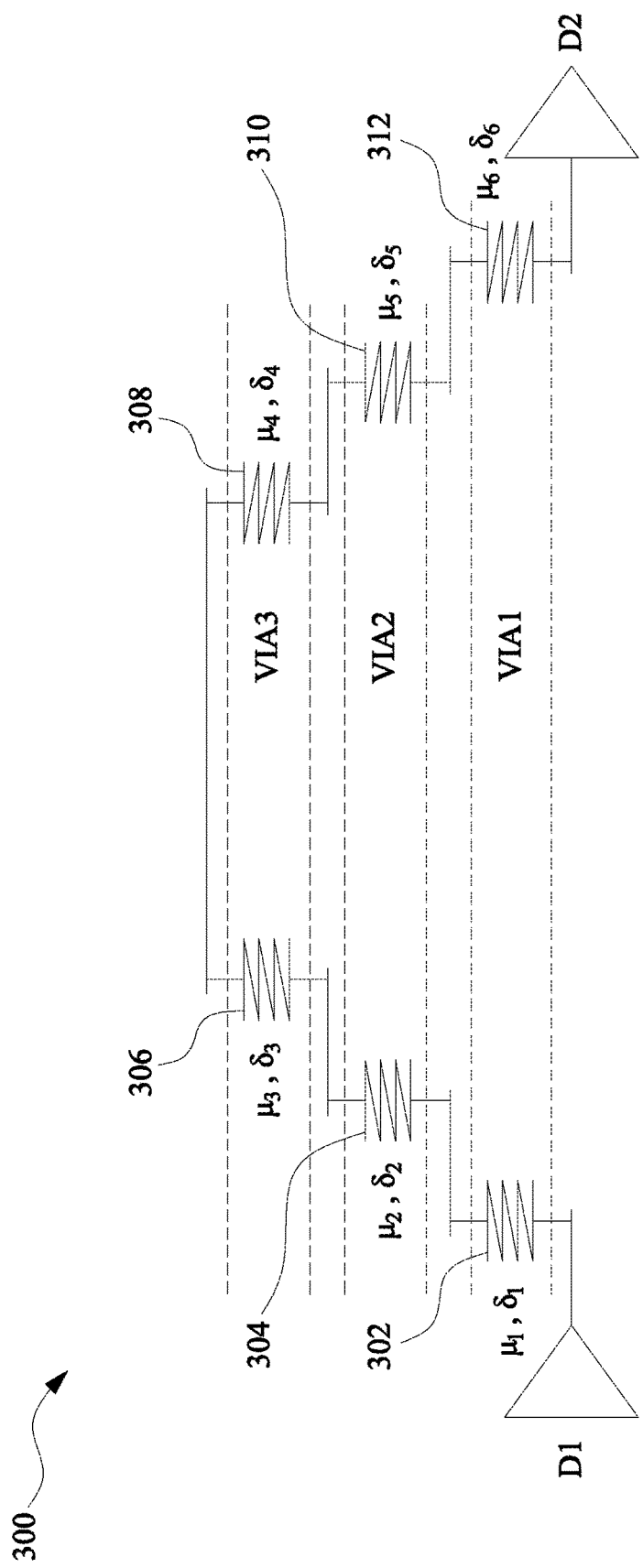
FIG. 3 is a schematic diagram of an interconnect structure in accordance with some embodiments.

The via variation reduction process is further described in a non-limiting example with respect to FIG. 3. FIG. 3 is a schematic diagram of an interconnect structure 300 in accordance with some embodiments. A first FEOL device D1 is electrically connected to a second FEOL device D2 by interconnect structure 300. Interconnect structure 300 includes a first via plug 302 directly connected to first FEOL device D1. First via plug 302 is located in a first level of interconnect structure 300. A second via plug 304 is connected in series with first via plug 302. Second via plug 304 is located in a second level of interconnect structure 300. A third via plug 306 is connected in series with second via plug 304. Third via plug 306 is located in a third level of interconnect structure 300. A fourth via plug 308 is connected in series with third via plug 306. Fourth via plug 308 is located in the third level of interconnect structure 300. A fifth via plug 310 is connected in series with fourth via plug 308. Fifth via plug 310 is located in the second level of interconnect structure 300. A sixth via plug 312 is connected in series with fifth via plug 310 and is connected to second FEOL device D2. Sixth via plug 312 is located in the first level of interconnect structure 300.

First via plug 302 includes a first typical resistance $\mu_1$ and a first resistance variation $\delta_1$. In some embodiments, first typical resistance $\mu_1$ and first resistance variation $\delta_1$ are determined in operations 110 and 112 (FIG. 1). Similarly, second via plug 304 includes a second typical resistance $\mu_2$ and a second resistance variation $\delta_2$. Third via plug 306, fourth via plug 308, fifth via plug 310 and sixth via plug 312 each have a respective typical resistance and resistance variation.

In a via variation reduction process, e.g., via variation reduction process of operation 114 (FIG. 1), the variation values in resistance in third via plug 306 and fourth via plug 308 are scaled down, in some embodiments. The variation values in resistance in third via plug 306 and fourth via plug 308 are scaled down due to the increased size of via plugs located in levels of interconnect structure 300 farthest from a substrate where first FEOL device D1 and second FEOL device D2 are located. In some embodiments, variation values of technology parameters of third via plug 306 and fourth via plug 308 are scaled down by a scaling factor, e.g., as $$\frac{1}{\sqrt{i}},$$

where i metal level of the via plug, when the resistance variation of the respective via plugs has a Gaussian distribution.

In a via variation reduction process, e.g., via variation reduction process of operation 114 (FIG. 1), the variation values in resistance in fifth via plug 310 and sixth via plug 312 are scaled down, in some embodiments. The variation values in resistance in fifth via plug 310 and sixth via plug 312 are scaled down due to the reduced amount of delay introduced by the fifth via plug and the sixth via plug relative to first via plug 302 or second via plug 304. In some embodiments, variation values of technology parameters of fifth via plug 310 and sixth via plug 312 are scaled down by a scaling factor, e.g., $$\frac{1}{\sqrt{i}},$$

where i is a metal level of the via plug, when the resistance variation of the respective via plugs has a Gaussian distribution.

In some embodiments, variation values of technology parameters of each via of first via plug 302 through sixth via plug 312 are scaled down by a scaling factor, e.g., $$\frac{1}{\sqrt{i}},$$

where i is a metal level of the via, when the resistance variation of the respective via has a Gaussian distribution. This scaling factor scheme places an increased emphasis on an impact of technology parameters for via plugs which are closer to the substrate and closer to an input portion of a signal propagation path. Via plugs which are farther from the substrate or closer to an output portion of the signal propagation path have less impact on delay variation due to manufacturing variation. Adjustments to technology parameters result in a produced circuit having a smaller area in comparison with a circuit which maintains technology parameters for all BEOL features. Adjustments to technology parameters also help to reduce power consumption in the produced circuit in comparison with circuits which maintains technology parameters for all BEOL features.

Returning to FIG. 1, method 100 continues with operation 124, where a techfile 134 with reduced via variation values is generated based on typical values and reduced variation values from operation 114. In some embodiments, operation 124 is omitted, and techfile 134 is not generated.

Method 100 continues with operation 116 in which a BEOL variation reduction process is performed. The BEOL variation reduction process scales down variation values for technology parameters for BEOL features by using a scaling factor, which is also referred to as a discounting factor α. In some circuits, delay variation introduced by FEOL devices dominants delay variation. In some circuits, FEOL devices account for 70% to 80% of all delay variation within a circuit. Due to the large amount of delay variation introduced by FEOL devices, scaling down of the variation values of technology parameters for all BEOL features by discounting factor α is usable without significantly impacting the accuracy of a subsequent resistance-capacitance extraction process or timing analysis process. In some embodiments, the discounting factor ranges from about 0.2 to about 1.0. In some embodiments, the discounting factor ranges from about 0.3 to about 0.5. In some embodiments, if the discounting factor is less than about 0.3, then scaling down of variation values of technology parameters of the BEOL features is not sufficient to satisfy the desired accuracy in the subsequent resistance-capacitance extraction process or timing analysis process. In some embodiments, if the discounting factor is greater than about 0.5, then the scaled down delay variation introduced by the BEOL features is not sufficient to help to design a circuit in a more realistic and/or aggressive manner, and thus the area of driving capability saved by the reduced variation values is insignificant compared with a counterpart design based on corner variation values.

Method 100 continues with operation 126, where a techfile 136 with reduced via variation values and reduced BEOL variation values is generated based on typical values, reduced via variation values from operation 114, and reduced BEOL variation values from operation 116.

Figure 2:
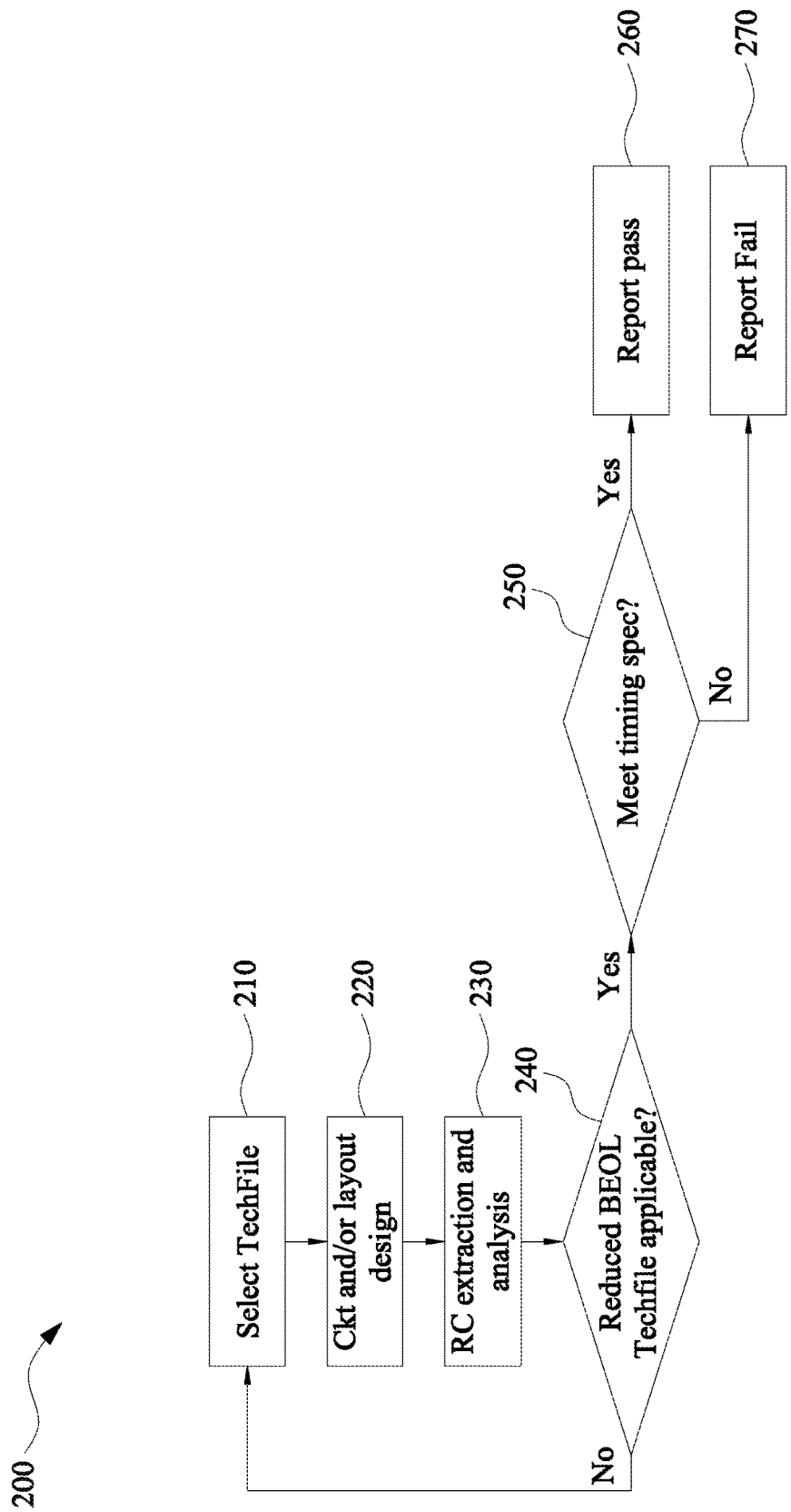
FIG. 2 is a flowchart of a method of designing a circuit in accordance with some embodiments.

FIG. 2 is a flowchart of a method 200 of designing a circuit in accordance with some embodiments. It is understood that additional operations may be performed before, during, and/or after the method 200 depicted in FIG. 2, and that some other processes may only be briefly described herein.

Method 200 begins with operation 210, where a circuit designer receives a plurality of techfiles and one or more model files, such as techfiles 132, 134, and 136 and simulation model file 108. The circuit designer selects one of the techfiles 132, 134, and 136 to begin with. In some embodiments, the circuit designer selects the most aggressive techfile, e.g., techfile 136, that has the greatest reduction in its variation estimation.

Method 200 continues with operation 220, where a circuit schematic and/or circuit layout is designed based on the selected techfile. Method 200 continues with operation 230 in which resistance-capacitance extraction and timing analysis of the layout of the circuit design is performed. The resistance-capacitance extraction and timing analysis is performed to determine the electrical performance of the circuit. In some embodiments, the resistance-capacitance extraction and timing analysis of the circuit design is performed by executing a computer software program. In some embodiments, the computer software program for performing operation 230 is also referred to as a post-layout simulation tool.

Method 200 continues with operation 240, where a determination is made whether the timing analysis matches the assumptions of the selected techfile 136. In operation 240, in order to determine whether reduced BEOL variation values in the techfile 136 are applicable, an amount of delay variation contributed by BEOL features is compared with an amount of variation delay contributed by FEOL devices. This comparison is performed by analyzing three different factors. A first factor is an amount of delay in a circuit where the BEOL features are in a corner condition and the FEOL devices are in a typical condition. A second factor is an amount of delay in a circuit where the BEOL features are in a typical condition and the FEOL devices are in the typical condition. A third factor is an amount of delay in a circuit where the BEOL features are in the typical condition and the FEOL devices are in a corner condition.

In some embodiments, an amount of delay for FEOL devices in the typical condition is obtained during operation 230. In some embodiments, an amount of delay for FEOL devices in the corner condition is obtained during operation 230. In some embodiments, an amount of delay for BEOL features in the typical condition is obtained in operation 230.

An amount of delay variation attributable to BEOL features is determined based on a difference between the first factor and the second factor. An amount of delay variation attributable to FEOL devices is determined based a difference between the third factor and the second factor. If the amount of delay variation attributable to FEOL devices is equal to or greater than the amount of delay attributable to BEOL features, then the reduced BEOL processes are applicable. In such scenario, method 200 proceeds to operation 250. Otherwise, method 200 goes back to operation 210, where the circuit designer selects a less aggressive techfile and start the circuit or layout designing process all over again based on the newly-selected, less aggressive techfile.

In operation 250, the timing analysis results from operation 230 of the circuit design is compared with the desired circuit performance characteristics. In some embodiments, the desired circuit performance characteristics are provided by a customer. In some embodiments, the desired circuit performance characteristics are provided by the circuit designer.

Method 200 continues with operation 260 if the timing analysis results from operation 230 of the circuit design satisfy the desired circuit performance characteristics. In operation 260, the circuit design and/or the corresponding layout design is finalized and preparation of masks for implementing the circuit layout for manufacturing begins.

Method 200 continues with operation 270 if the timing analysis results from operation 230 of the circuit design do not satisfy the desired circuit performance characteristics. In operation 270, the fail result is reported the circuit designer, and the circuit designer will take further actions to resolve this issue, such as having the circuit schematic of layout redesigned. In some embodiments, the circuit is redesigned by adjusting the at least one of an FEOL device or a BEOL feature. In some embodiments, the circuit is redesigned by adjusting a power supplied to the circuit. In some embodiments, the circuit is redesigned by including at least one additional FEOL device or BEOL feature; by removing at least one FEOL device or BEOL feature; or by another suitable redesign operation.

Figure 4:
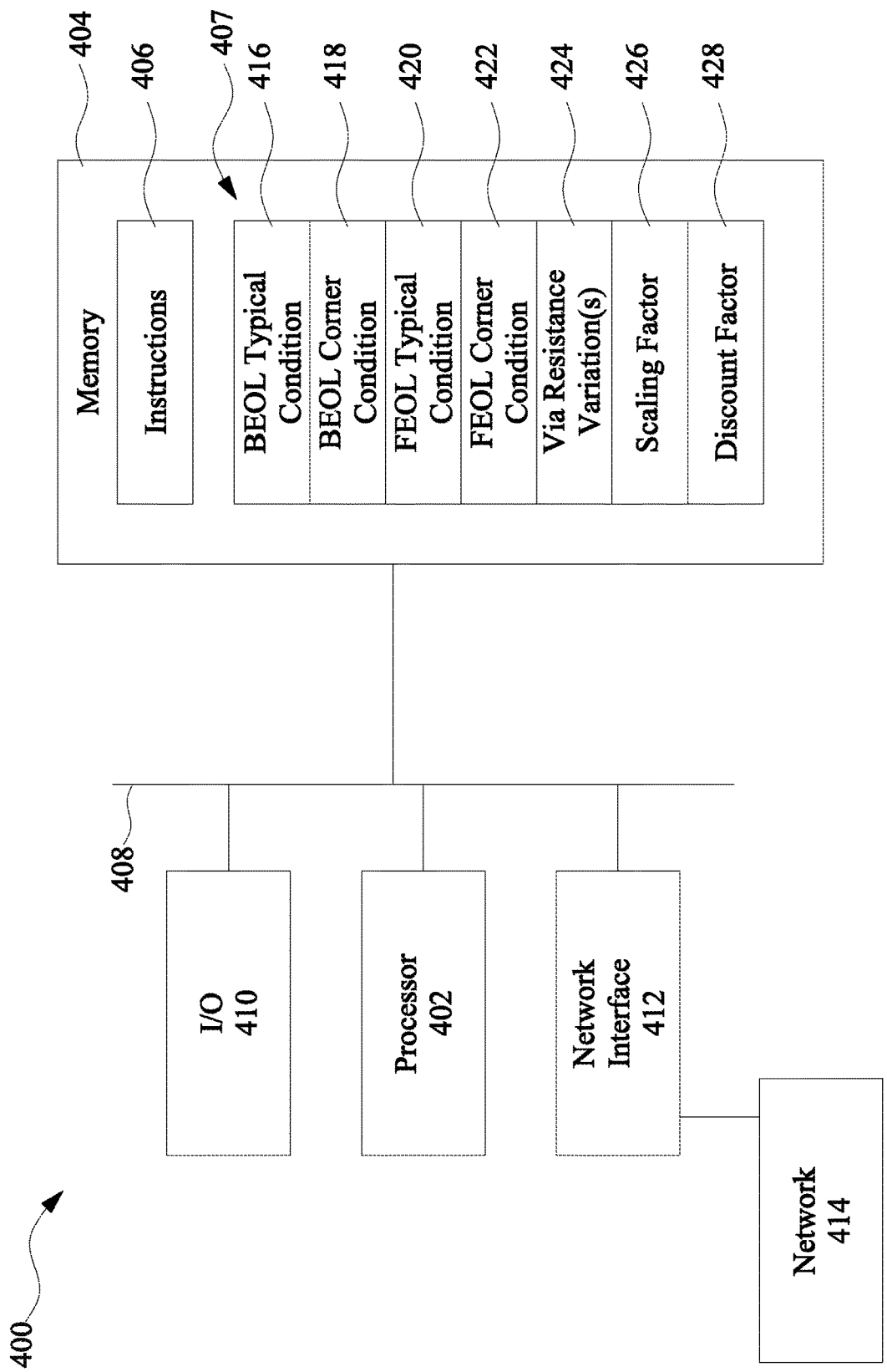
FIG. 4 is a schematic view of a system for generating the one or more techfiles or for designing a circuit in accordance with some embodiments.

FIG. 4 is a schematic view of a system 400 for generating tech files and/or for designing a circuit in accordance with some embodiments. System 400 includes a hardware processor 402 and a non-transitory, computer readable storage medium 404 encoded with, i.e., storing, the computer program code 406, i.e., a set of executable instructions. Computer readable storage medium 404 is also encoded with instructions 407 for interfacing with manufacturing machines for producing the memory array. The processor 402 is electrically coupled to the computer readable storage medium 404 via a bus 408. The processor 402 is also electrically coupled to an I/O interface 410 by bus 408. A network interface 412 is also electrically connected to the processor 402 via bus 408. Network interface 412 is connected to a network 414, so that processor 402 and computer readable storage medium 404 are capable of connecting to external elements via network 414. The processor 402 is configured to execute the computer program code 406 encoded in the computer readable storage medium 404 in order to cause system 400 to be usable for performing a portion or all of the operations as described in method 100 and/or method 200.

In some embodiments, the processor 402 is a central processing unit (CPU), a multi-processor, a distributed processing system, an application specific integrated circuit (ASIC), and/or a suitable processing unit.

In some embodiments, the computer readable storage medium 404 is an electronic, magnetic, optical, electromagnetic, infrared, and/or a semiconductor system (or apparatus or device). For example, the computer readable storage medium 404 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 304 includes a compact disk-read only memory (CD-ROM), a compact disk-read/write (CD-R/W), and/or a digital video disc (DVD).

In some embodiments, the storage medium 404 stores the computer program code 406 configured to cause system 400 to perform method 100 and/or method 200. In some embodiments, the storage medium 404 also stores information needed for performing method 100 and/or method 200 as well as information generated during performing the method 100 and/or method 200, such as a BEOL typical condition parameter 416, a BEOL corner condition parameter 418, a FEOL typical condition parameter 420, a FEOL corner condition parameter 422, a via resistance variation(s) parameter 424, a scaling factor parameter 426, a discounting factor parameter 428 and/or a set of executable instructions to perform the operation of method 100 and/or method 200. In some embodiments, some or all of the information 416-428 are recorded in the form of simulation model file 108 and techfiles 132, 134, and 136 (FIG. 1).

In some embodiments, the storage medium 404 stores instructions 407 for interfacing with manufacturing machines. The instructions 407 enable processor 402 to generate manufacturing instructions readable by the manufacturing machines to effectively implement method 100 and/or method 200 during a circuit design process.

System 400 includes I/O interface 410. I/O interface 410 is coupled to external circuitry. In some embodiments, I/O interface 410 includes a keyboard, keypad, mouse, trackball, trackpad, and/or cursor direction keys for communicating information and commands to processor 402.

System 400 also includes network interface 412 coupled to the processor 402. Network interface 412 allows system 400 to communicate with network 414, to which one or more other computer systems are connected. Network interface 412 includes wireless network interfaces such as BLUETOOTH, WIFI, WIMAX, GPRS, or WCDMA; or wired network interface such as ETHERNET, USB, or IEEE-1394. In some embodiments, method 100 and/or method 200 is implemented in two or more systems 400, and information such as memory type, memory array layout, I/O voltage, I/O pin location and charge pump are exchanged between different systems 400 via network 414.

System 400 is configured to receive information related to BEOL typical conditions. The information is transferred to processor 402 via bus 408 and is then stored in computer readable medium 404 as BEOL typical condition parameter 416. In some embodiments, the BEOL typical conditions are obtained in operation 110 (FIG. 1). System 400 is configured to receive information related to BEOL corner conditions which is stored in computer readable medium 404 as BEOL corner condition parameter 418. In some embodiments, the BEOL corner conditions are obtained in operation 112. System 400 is configured to receive information related to FEOL typical conditions which is stored in computer readable medium 404 as FEOL typical condition parameter 420. In some embodiments, the FEOL typical conditions are obtained in operation 102. System 400 is configured to receive information related to FEOL corner conditions which is stored in computer readable medium 404 as FEOL corner condition parameter 422. In some embodiments, the FEOL corner conditions are obtained in operation 104. System 400 is configured to receive information related to via resistance variation(s) which is stored in computer readable medium 404 as via resistance variation(s) parameter 424. In some embodiments, the via resistance variations(s) are obtained in operation 424. System 400 is configured to receive information related to the scaling factor which is stored in computer readable medium 404 as scaling factor parameter 426. In some embodiments, the scaling factor is obtained in operation 114. System 400 is configured to receive information related to the discounting factor which is stored in computer readable medium 404 as discounting factor parameter 428. In some embodiments, the discounting parameter is obtained in operation 116.

In some embodiments, a method of designing a circuit to be fabricated by a predetermined fabrication process comprises designing a first layout of the circuit based on a first plurality of corner variation values for an electrical characteristic of a corresponding plurality of BEOL features of the circuit to be fabricated by the predetermined fabrication process. The method further comprises, using a processor, calculating, based on the circuit layout, a first delay attributable to the plurality of BEOL features and a second delay attributable to a plurality of FEOL devices of the circuit. The method further comprises, if the first delay is greater than the second delay, designing a second layout of the circuit based on a second plurality of corner variation values for the electrical characteristic of the corresponding plurality of BEOL features. Each corner variation value of the first plurality of corner variation values is obtained by multiplying a corresponding corner variation value of the second plurality of corner variation values by a corresponding scaling factor.

In some embodiments, a system for designing a circuit to be fabricated by a predetermined fabrication process comprises a processor and a non-transitory, computer readable storage medium configured to store executable instructions. The executable instructions configured to cause the processor to receive a layout of the circuit, receive one or more typical values and one or more reduced corner variation values usable to model an electrical characteristic of a plurality of BEOL features to be fabricated by the predetermined fabrication process, and perform a timing analysis based on the layout, the one or more typical values, and the one or more reduced corner variation values. The timing analysis comprises obtaining a first delay attributable to the plurality of BEOL features of the circuit, obtaining a second delay attributable to a plurality of front end of line (FEOL) devices of the circuit, and determining if the first delay is less than the second delay.

In some embodiments, a method of designing a circuit to be fabricated by a predetermined fabrication process comprises designing a layout of the circuit based on a first techfile, the first techfile being generated based on one or more typical values and one or more reduced corner variation values usable to model an electrical characteristic of a plurality of BEOL features to be fabricated by the predetermined fabrication process, and performing, using a processor, a timing analysis based on the layout and the first techfile. Performing the timing analysis comprises obtaining a first delay attributable to the plurality of BEOL features of the circuit, obtaining a second delay attributable to a plurality of FEOL devices of the circuit, and comparing a result of the timing analysis with a predetermined timing specification if the first delay is less than the second delay. The method further comprises performing another timing analysis based on the layout and a second techfile if the first delay is greater than the second delay, the second techfile being generated based on the one or more typical values and one or more original corner variation values usable to model the electrical characteristic of the plurality of BEOL features to be fabricated by the predetermined fabrication process. A reduced corner variation value of the one or more reduced corner variation values is equal to a corresponding one of the one or more original corner variation values multiplied by a corresponding scaling factor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a circuit by a predetermined fabrication process, the method comprising:
    designing a first layout of the circuit based on a first plurality of corner variation values for an electrical characteristic of a corresponding plurality of back end of line (BEOL) features of the circuit to be fabricated by the predetermined fabrication process;
    using a processor, calculating, based on the first layout, a first delay attributable to the plurality of BEOL features and a second delay attributable to a plurality of front end of line (FEOL) devices of the circuit;
    if the first delay is greater than the second delay, designing a second layout of the circuit based on a second plurality of corner variation values for the electrical characteristic of the corresponding plurality of BEOL features,
    wherein each corner variation value of the first plurality of corner variation values is obtained by multiplying a corresponding corner variation value of the second plurality of corner variation values by a corresponding scaling factor,
    in response to the first delay being greater than the second delay, fabricating the circuit based on the second layout; and
    in response to the first delay not being greater than the second delay, fabricating the circuit based on the first layout.

2. The method of claim 1, wherein each corner variation value of the first plurality of corner variation values is obtained by multiplying the corresponding corner variation value of the second plurality of corner variation values by a same discounting factor.

3. The method of claim 2, wherein the same discounting factor ranges from 0.3 to 0.5.

4. The method of claim 1, wherein the scaling factor for each corner variation value of the second plurality of corner variation values is based on a layer number of a corresponding BEOL feature of the plurality of BEOL features.

5. The method of claim 4, wherein the layer number of each BEOL feature of the plurality of BEOL features is given by i and each scaling factor is set as $$\frac{1}{\sqrt{i}}.$$

6. The method of claim 4, wherein the layer number of each BEOL feature of the plurality of BEOL features corresponds to a metal level of a via plug feature.

7. The method of claim 1, wherein the second plurality of corner variation values is based on measured values of the electrical characteristic.

8. The method of claim 1, wherein calculating the first delay comprises comparing a first factor to a second factor, wherein
    the first factor is based on the plurality of BEOL features being in a typical BEOL condition and the plurality of FEOL devices being in a typical FEOL condition, and
    the second factor is based on the plurality of BEOL features being in a corner condition and the plurality of FEOL devices being in the typical FEOL condition.

9. The method of claim 1, wherein calculating the second delay comprises comparing a first factor to a second factor, wherein
    the first factor is based on the plurality of BEOL features being in a typical BEOL condition and the plurality of FEOL devices being in a typical FEOL condition, and
    the second factor is based on the plurality of BEOL features being in the typical BEOL condition and the plurality of FEOL devices being in a corner condition.

10. The method of claim 1, further comprising obtaining the first plurality of corner variation values for the electrical characteristic of the corresponding plurality of BEOL features from a first techfile, and obtaining the second plurality of corner variation values for the electrical characteristic of the corresponding plurality of BEOL features from a second techfile.

11. The method of claim 1, further comprising:
    preparing a set of masks based on the first layout or the second layout for fabrication of the circuit by the predetermined fabrication process.

12. A system for fabricating a circuit by a predetermined fabrication process, the system comprising:
    a processor;
    a non-transitory, computer readable storage medium configured to store executable instructions, the executable instructions configured to cause the processor to:
    receive a first layout of the circuit;
    receive one or more typical values and one or more reduced corner variation values usable to model an electrical characteristic of a plurality of back end of line (BEOL) features to be fabricated by the predetermined fabrication process;
    perform a timing analysis based on the first layout, the one or more typical values, and the one or more reduced corner variation values, the timing analysis comprising:
        obtaining a first delay attributable to the plurality of BEOL features of the circuit;
        obtaining a second delay attributable to a plurality of front end of line (FEOL) devices of the circuit; and
        determining if the first delay is less than the second delay;
    if the first delay is greater than the second delay, designing a second layout of the circuit;
    in response to the first delay being less than the second delay, providing the first layout to a fabrication facility to fabricate the circuit based on the first layout; and
    in response to the first delay being greater than the second delay, providing the first layout to the fabrication facility to fabricate the circuit based on the second layout.

13. The system of claim 12, wherein the executable instructions are configured to cause the processor to receive the one or more typical values and the one or more reduced corner variation values from a techfile.

14. The system of claim 12, wherein the executable instructions are configured to cause the processor to obtain the first delay by comparing a first factor to a second factor, wherein
the first factor is based on the plurality of BEOL features being in a typical BEOL condition and the plurality of FEOL devices being in a typical FEOL condition, and
the second factor is based on the plurality of BEOL features being in a corner condition and the plurality of FEOL devices being in the typical FEOL condition.

15. The system of claim 12, wherein the executable instructions are configured to cause the processor to obtain the second delay by comparing a first factor to a second factor, wherein
the first factor is based on the plurality of BEOL features being in a typical BEOL condition and the plurality of FEOL devices being in a typical FEOL condition, and
the second factor is based on the plurality of BEOL features being in the typical BEOL condition and the plurality of FEOL devices being in a corner condition.

16. A method of fabricating a circuit by a predetermined fabrication process, the method comprising:
designing a layout of the circuit based on a first techfile, the first techfile being generated based on one or more typical values and one or more reduced corner variation values usable to model an electrical characteristic of a plurality of back end of line (BEOL) features to be fabricated by the predetermined fabrication process;
performing, using a processor, a timing analysis based on the layout and the first techfile, the performing the timing analysis comprising:
obtaining a first delay attributable to the plurality of BEOL features of the circuit; and
obtaining a second delay attributable to a plurality of front end of line (FEOL) devices of the circuit;
comparing a result of the timing analysis with a predetermined timing specification if the first delay is less than the second delay;
performing another timing analysis based on the layout and a second techfile if the first delay is greater than the second delay, the second techfile being generated based on the one or more typical values and one or more original corner variation values usable to model the electrical characteristic of the plurality of BEOL features to be fabricated by the predetermined fabrication process,
a reduced corner variation value of the one or more reduced corner variation values being equal to a corresponding one of the one or more original corner variation values multiplied by a corresponding scaling factor;
in response to the performing the another timing analysis based on the layout and the second techfile, fabricating the circuit based on the layout; and
in response to the comparing the result of the timing analysis with the predetermined timing specification, fabricating the circuit based on the layout.

17. The method of claim 16, wherein the performing the timing analysis based on the layout and the first techfile comprises:
performing a resistance-capacitance extraction on the layout according to the first techfile.

18. The method of claim 16, wherein the electrical characteristic comprises a resistance of a layer of the plurality of BEOL features, and the one or more typical values is a unit resistance value.

19. The method of claim 16, wherein the electrical characteristic comprises a capacitance of a layer of the plurality of BEOL features, and the one or more typical values is a unit capacitance value.

20. The method of claim 16, wherein the performing the another timing analysis based on the layout and the second techfile comprises:
performing a resistance-capacitance extraction on the layout according to the second techfile.

* * * * *